(12) United States Patent
Inoue et al.

(10) Patent No.: US 8,581,316 B2
(45) Date of Patent: Nov. 12, 2013

(54) SEMICONDUCTOR DEVICE AND METHOD OF MANUFACTURING THE SAME

(75) Inventors: Ayako Inoue, Chiba (JP); Kazuhiro Tsumura, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/409,261

(22) Filed: Mar. 1, 2012

(65) Prior Publication Data

US 2012/0228686 A1   Sep. 13, 2012

(30) Foreign Application Priority Data

Mar. 8, 2011   (JP) .................................. 2011-050242

(51) Int. Cl.
*H01L 27/108* (2006.01)

(52) U.S. Cl.
USPC ........... 257/296; 257/379; 257/532; 257/288; 257/531; 257/506; 438/253; 438/382; 438/210; 438/258

(58) Field of Classification Search
USPC ................. 257/296, 379, 532, 288, 531, 506; 438/253, 382, 210, 258
See application file for complete search history.

(56) References Cited

U.S. PATENT DOCUMENTS

| | | | | |
|---|---|---|---|---|
| 5,773,871 A * | 6/1998 | Boyd et al. | ...................... | 257/532 |
| 5,837,592 A * | 11/1998 | Chang et al. | .................. | 438/382 |
| 5,930,638 A * | 7/1999 | Reedy et al. | .................. | 438/382 |
| 6,225,658 B1 * | 5/2001 | Watanabe | ...................... | 257/296 |
| 6,448,137 B1 * | 9/2002 | Lai et al. | ........................ | 438/258 |
| 6,483,152 B1 * | 11/2002 | Kim | .............................. | 257/379 |
| 6,613,625 B1 * | 9/2003 | Hasegawa et al. | ............. | 438/210 |
| 6,888,219 B2 * | 5/2005 | Keyser | ........................... | 257/532 |
| 7,022,246 B2 * | 4/2006 | Chinthakindi et al. | ........... | 216/6 |
| 7,453,135 B2 * | 11/2008 | Iwamatsu et al. | ............. | 257/506 |
| 8,058,125 B1 * | 11/2011 | Lin et al. | ........................ | 438/238 |
| 2004/0130434 A1 * | 7/2004 | Chinthakindi et al. | ........ | 338/309 |
| 2005/0012159 A1 * | 1/2005 | Sekimoto | ....................... | 257/379 |
| 2006/0246654 A1 * | 11/2006 | Shin | .............................. | 438/238 |
| 2007/0090417 A1 * | 4/2007 | Kudo | ............................. | 257/288 |
| 2007/0207579 A1 * | 9/2007 | Omura | ........................... | 438/253 |
| 2008/0042237 A1 * | 2/2008 | Iwamatsu et al. | ............. | 257/531 |
| 2010/0151651 A1 * | 6/2010 | Beach | ........................... | 438/382 |
| 2011/0062505 A1 * | 3/2011 | Omura | ........................... | 257/296 |
| 2012/0119872 A1 * | 5/2012 | Leung et al. | .................... | 338/25 |
| 2013/0009225 A1 * | 1/2013 | Kocon | ........................... | 257/296 |

FOREIGN PATENT DOCUMENTS

JP    2003272726    10/2003

* cited by examiner

*Primary Examiner* — Fernando L. Toledo
*Assistant Examiner* — Mohammed Shamsuzzaman
(74) *Attorney, Agent, or Firm* — Adams & Wilks

(57) ABSTRACT

Provided is a semiconductor device including, on the same semiconductor substrate, a transistor element, a capacitor, and a resistor. The capacitor is formed on an active region, and the resistor is formed on an element isolation region, both formed of the same polysilicon film. By CMP or etch-back, the surface is ground down while planarizing the surface until a resistor has a desired thickness. Owing to a difference in height between the active region and the element isolation region, a thin resistor and a thick upper electrode of the capacitor are formed to prevent passing through of a contact.

5 Claims, 4 Drawing Sheets

SEMICONDUCTOR DEVICE AND METHOD OF MANUFACTURING THE SAME

BACKGROUND OF THE INVENTION

1. Field of the Invention

The present invention relates to a semiconductor device having a metal-oxide-semiconductor field effect transistor (MOSFET), a capacitor, and a resistor, all on the same substrate, and also relates to a method of manufacturing the semiconductor device.

2. Description of the Related Art

In recent years, capacitors and resistors have been widely used in analog circuits. Further, along with increase in circuit scale and degree of integration, a semiconductor device in which a transistor element, a capacitor, and a resistor are mounted together on the same semiconductor substrate has become the mainstream.

In particular, in the analog circuits, resistors of high resistance made of polysilicon are widely used. In this case, as a useful method for stably increasing the resistance of the resistor, there is employed a method of reducing the thickness of the resistor. Meanwhile, since a manufacturing process is simplified in an effort to unify the structure and share the process in a method of manufacturing the respective circuit element, in many cases, a gate electrode of the transistor and a lower electrode of the capacitor; and an upper electrode of the capacitor and the resistor are respectively made of the same polysilicon film at the same time.

Accordingly, reduction of the thickness of the resistor in order to increase the resistance of the resistor simultaneously reduces the thickness of the upper electrode of the capacitor.

Reduction of the thickness of the upper electrode of the capacitor may cause the following troubles.

(a) A contact hole at the upper electrode of the capacitor is shallow, and hence the upper electrode is easily subjected to over etching. The reliability deteriorates and passing through of a contact causes failure of the capacitor.

(b) Thin thickness of the upper electrode causes the resistance to be high, making voltage dependence of a parasitic resistance or the like large, which causes reduction in function as an electrode.

Japanese Published Patent Application No. 2003-282726 discloses a method of manufacturing a semiconductor device including contacts formed in contact holes having different lengths, in which a surface of the circuit element corresponding to the short contact hole is prevented from being subjected to over etching. According to Japanese Published Patent Application No. 2003-282726, a nitride film is formed on each circuit element as a stopper film, to thereby prevent the circuit element from being subjected to over etching when etching for forming the contact hole is performed.

However, when the high resistance resistor necessary for the analog device and the capacitor are formed of the same polysilicon film, the method of manufacturing a semiconductor device described in Japanese Published Patent Application No. 2003-282726 can solve the above-mentioned trouble (a), but cannot solve the above-mentioned trouble (b), and hence a capacitor with a sufficient function cannot be manufactured.

SUMMARY OF THE INVENTION

It is an object of the present invention to provide a method of manufacturing a semiconductor device including, on the same semiconductor substrate, a transistor element, a capacitor, and a resistor, the method being capable of manufacturing the capacitor with a sufficient function.

The present invention employs the following measure to achieve the above-mentioned object.

A capacitor is formed on an active region and a resistor is formed on an element isolation region so that an upper surface of the resistor becomes larger in height than an upper surface of an upper electrode of the capacitor. After that, a surface of a semiconductor substrate is ground down while planarizing the surface until the resistor has a desired thickness. At this time, owing to the step formed between the active region and the element isolation region, a thin resistor and a thick capacitor are simultaneously formed.

Owing to the thick upper electrode of the capacitor, which is formed by the above-mentioned measure, it is possible to prevent passing through of a contact and characteristic deterioration such as increase in voltage dependency along with increase in resistance, with the result that the capacitor with a sufficient function can be manufactured.

According to the present invention, in the semiconductor device including, on the same semiconductor substrate, the transistor element, the resistor, and the capacitor, by utilizing the step formed between the active region and the element isolation region, the thin resistor having a high resistance and the thick upper electrode of the capacitor can be simultaneously formed, and hence the capacitor may be formed in the common process with the high resistance resistor necessary for an analog circuit, and further, the capacitor with a sufficient function can be manufactured.

DETAILED DESCRIPTION OF THE PREFERRED EMBODIMENT

Hereinafter, an embodiment of the present invention is described in detail.

Figure 1:
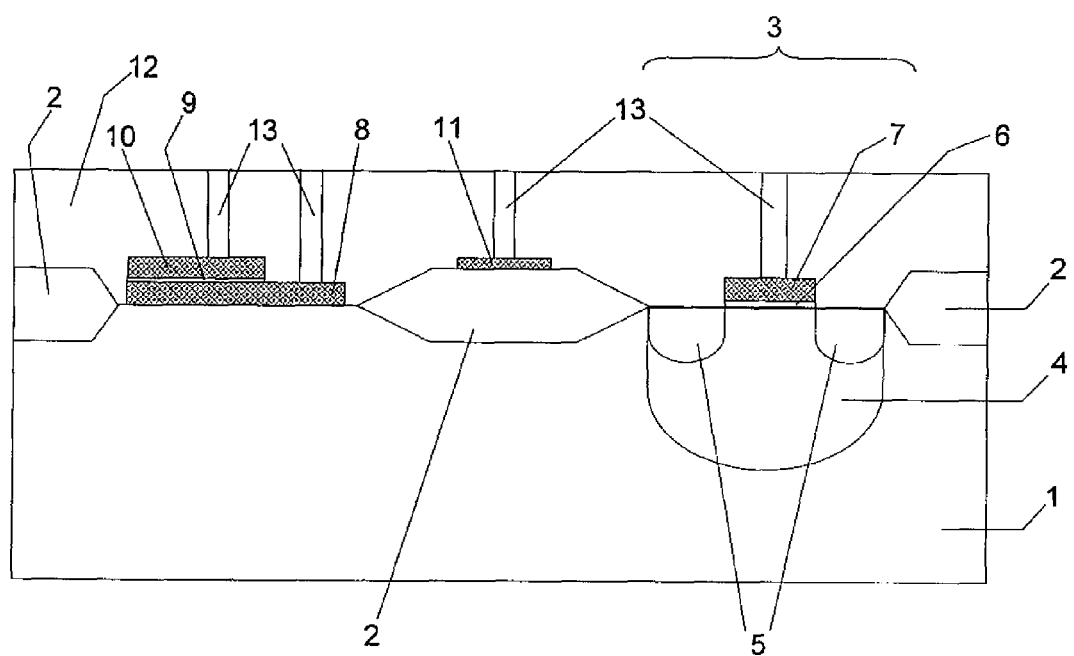
FIG. 1 is a sectional view illustrating an element structure of a semiconductor device according to the present invention.

FIG. 1 is a view illustrating a structure of a semiconductor device manufactured in this embodiment, including a transistor element, a capacitor, and a resistor on the same substrate.

First, the structure of the semiconductor device manufactured in this embodiment is described with reference to FIG. 1.

As illustrated in FIG. 1, on a semiconductor substrate 1, there are formed an active region, which is an element forming region, and an element isolation region 2, which is formed of a silicon oxide film having a surface set higher in height than that of the active region. In the active region, a MOSFET transistor is formed. In a transistor forming region 3, a well region 4 of a first conductivity type is formed along a main surface of the semiconductor substrate 1. In the well region 4, a source region 5 and a drain region 5 are formed by diffusing high-concentration impurities of a second conductivity type. On a surface of the substrate in which the source region 5 and the drain region 5 are formed, a gate electrode 7 is formed on a gate oxide film 6. The transistor element of this embodiment is thus formed.

The capacitor is formed on the active region. A lower electrode 8 for the capacitor is formed of the same conductive film (the first polysilicon film) as the gate electrode 7 of the CMOS transistor element. On the lower electrode 8, an upper electrode 10 is formed through intermediation of a capacitor insulator 9. The capacitor insulator 9 is formed of a silicon oxide film, and the upper electrode 10 is formed of the second polysilicon film into which impurities of the first conductivity type are implanted.

A resistor 11 is formed on the element isolation region 2. The resistor 11 is formed of the same conductive film as the second polysilicon film constructing the upper electrode 10 of the capacitor, into which impurities of the first conductivity type are implanted. However, the thickness of the resistor 11 and the thickness of the upper electrode 10 are different from each other, and a thickness difference therebetween is determined depending on a step between the surface of the element isolation region 2 and the surface of the active region. That is, the resistor 11, which is formed on the silicon oxide film corresponding to the element isolation region whose height of the surface is high, and the upper electrode 10 of the capacitor, which is formed on the active region whose height of the surface is not high, are formed of the same second polysilicon film, but the thicknesses thereof are different from each other, and the thickness difference therebetween is determined depending on the step formed between the surface of the element isolation region and the surface of the active region.

Further, on the transistor element, the capacitor, and the resistor, an interlayer insulator 12 formed of, for example, a silicon oxide film is formed. In the interlayer insulator, contact holes 13 are opened so as to reach to surfaces of the gate electrode 7, the source region 5, and the drain region 5 of the transistor element, surfaces of the lower electrode 8 and the upper electrode 10 of the capacitor, and a surface of the resistor 11, respectively. The respective elements are connected to a wiring layer via the contact holes 13. Thus, the semiconductor device to be manufactured in this embodiment is formed.

When the first conductivity type is set to P type, the second conductivity type is N type, and when the first conductivity type is set to N type, the second conductivity type is P type.

Next, a method of manufacturing the semiconductor device of this embodiment structured as described above is described with reference to FIGS. 2A to 4C.

In this embodiment, as an example, description is made of a semiconductor device including, on a P-type substrate, an N-channel type MOS transistor element, a PIP-type capacitor in which an insulator is formed between polysilicon films, and a resistor made of polysilicon.

Figure 2A:
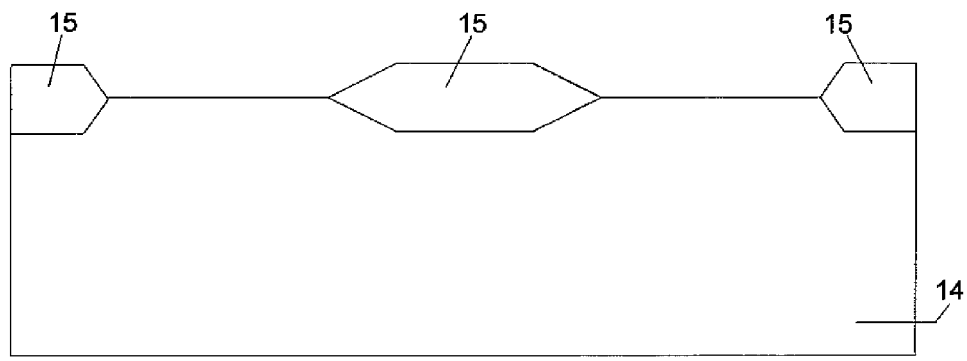
FIGS. 2A to 2C are sectional views schematically illustrating steps of a manufacturing process of the present invention.

First, as illustrated in FIG. 2A, on a P-type semiconductor substrate 14, by local oxidation of silicon (LOCOS), which is an existing element isolation technology, an active region, which is the element forming region, and an element isolation region 15 are formed. Here, the element isolation region 15 is positioned so that a surface thereof is larger in height than a surface of the active region.

Figure 2B:
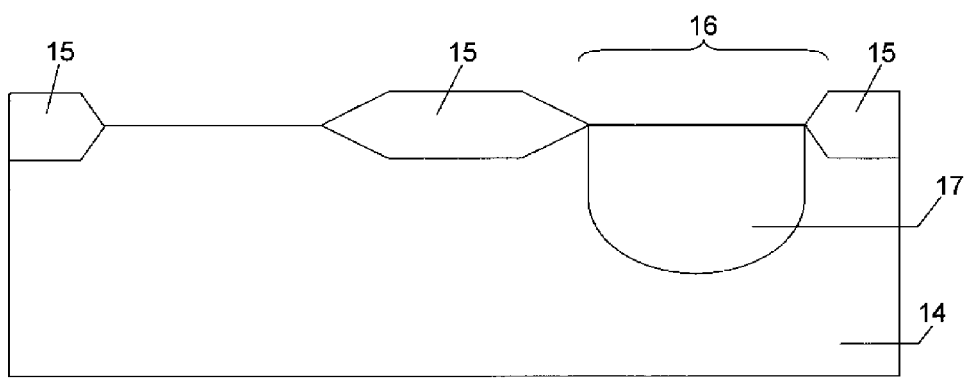

Next, as illustrated in FIG. 2B, into a transistor region 16, which is a part of the active region formed in the P-type semiconductor substrate 14, P-type impurities are implanted at a dose amount ranging from $5 \times 10^{12}$ atoms/cm$^2$ to $1 \times 10^{13}$ atoms/cm$^2$ via a sacrifice oxide film (not shown) having a thickness of about 500 Å. Then, heat treatment is performed, to thereby form a P-type well region 17.

Figure 2C:
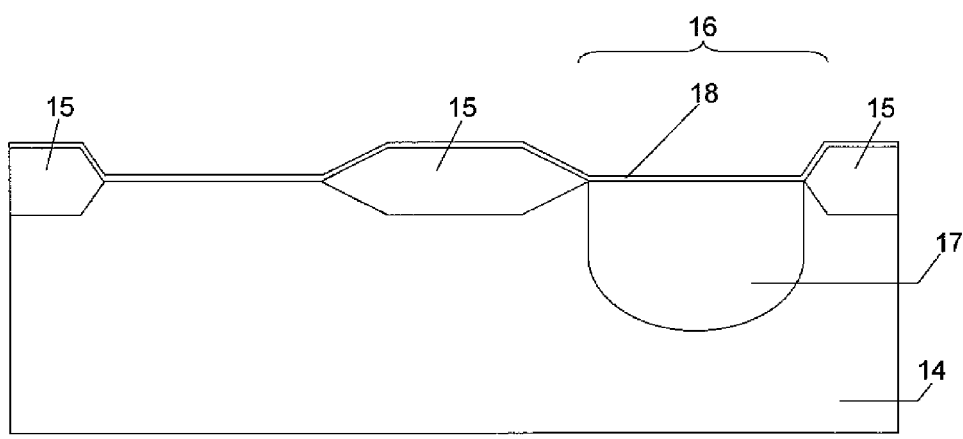

Next, as illustrated in FIG. 2C, on a surface of the P-type well region 17, after the sacrifice oxide film is peeled off, a gate oxide film 18 is formed to have a thickness of about 400 Å by thermal oxidation.

Figure 3A:
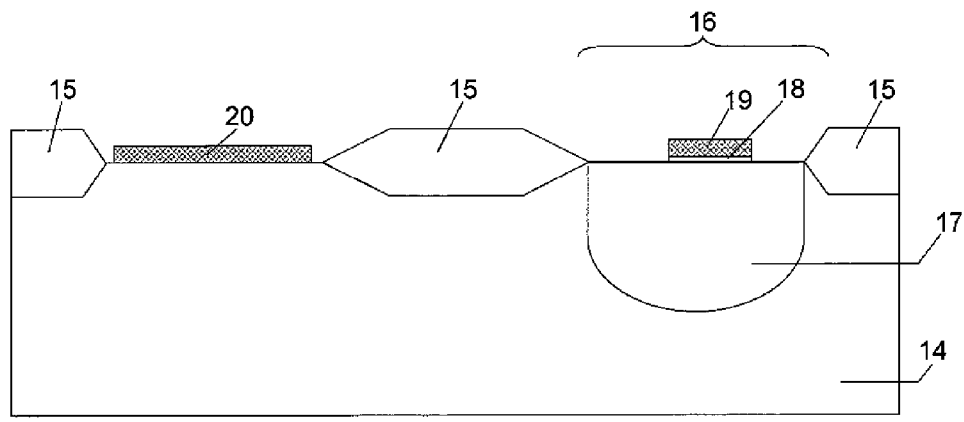
FIGS. 3A to 3C are sectional views schematically illustrating steps of the manufacturing process of the present invention, which follow the steps illustrated in FIGS. 2A to 2C.

Next, as illustrated in FIG. 3A, a first polysilicon film (not shown) is deposited to have a thickness of about 2,800 Å on the entire surface of the substrate by CVD, and N-type impurities are ion-implanted therein at a dose amount ranging from $1 \times 10^{15}$ atoms/cm$^2$ to $1 \times 10^{16}$ atoms/cm$^2$. Then, heat treatment and etching are performed, to thereby form, in the active region, a gate electrode 19 and a lower electrode 20 of the capacitor, which are formed of the first polysilicon film.

Next, in a source region and a drain region of the transistor element, N-type impurities are ion-implanted at a dose amount ranging from $3 \times 10^{15}$ atoms/cm$^2$ to $5 \times 10^{15}$ atoms/cm$^2$. Then, heat treatment is performed, to thereby form a source region 21 and a drain region 21. Here, impurity implantation to the polysilicon film and impurity implantation to the source region and the drain region may be simultaneously performed at the same dose amount.

Figure 3B:
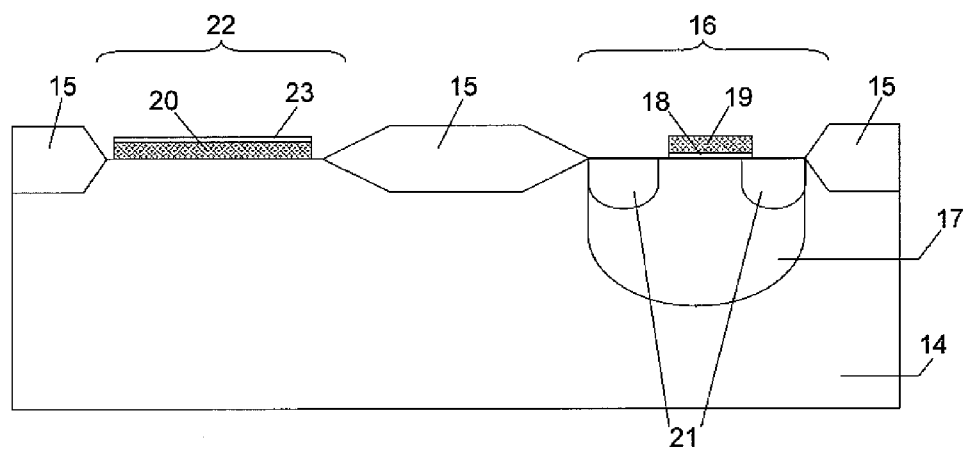

Next, as illustrated in FIG. 3B, in a capacitor region 22, silicon oxide is deposited to have a thickness of about 250 Å by CVD. Then, etching is performed, to thereby form a capacitor insulator 23.

Figure 3C:
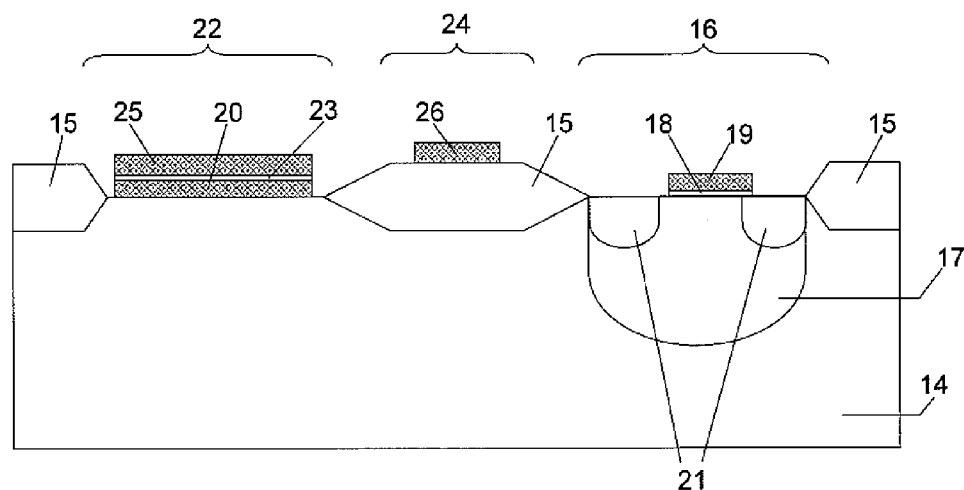

Next, as illustrated in FIG. 3C, in the capacitor region 22 and a resistor region 24, a second polysilicon film is deposited to have a thickness of about 2,800 Å on the entire surface of the substrate by CVD. Then, etching is performed, to thereby form polysilicon films to be formed as an upper electrode 25 of the capacitor and a resistor 26. Then, the upper electrode 25 of the capacitor and the resistor 26 are subjected to ion implantation of impurities. At this time, the impurity implantation into the source region and the drain region in the prior step and the impurity implantation into the upper electrode 25 of the capacitor and the resistor 26 may be simultaneously performed at the same dose amount. Further, in the above, note that description is made of a method in which the polysilicon film is first subjected to etching and then to impurity implantation. However, the order may be such that the entire surface of the polysilicon film is first subjected to impurity implantation, and then to etching to obtain the upper electrode 25 of the capacitor and the resistor 26.

Figure 4A:
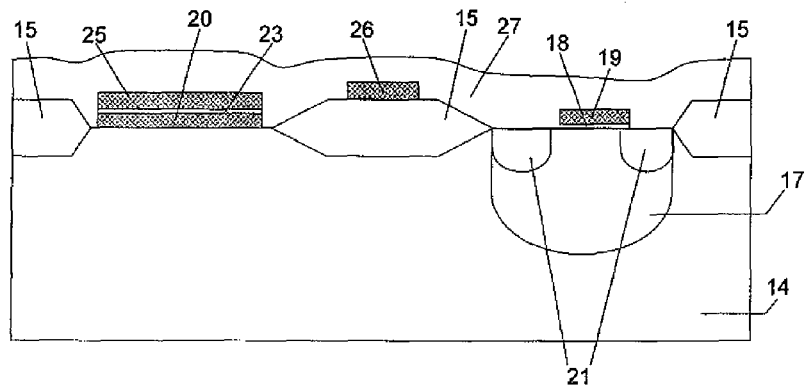
FIGS. 4A to 4C are sectional views schematically illustrating steps of the manufacturing process of the present invention, which follow the steps illustrated in FIGS. 3A to 3C.

Next, as illustrated in FIG. 4A, on the entire surface of the substrate, an interlayer insulator 27 formed of, for example, a silicon oxide film is formed.

Figure 4B:
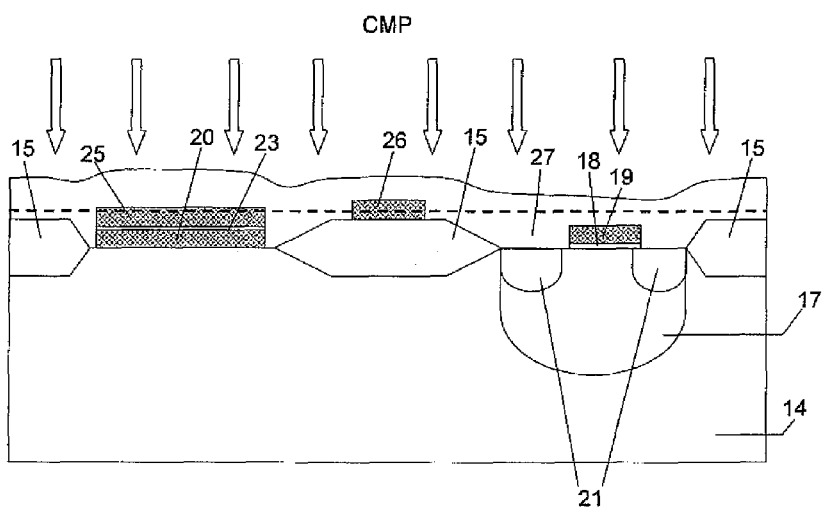
Figure 4C:
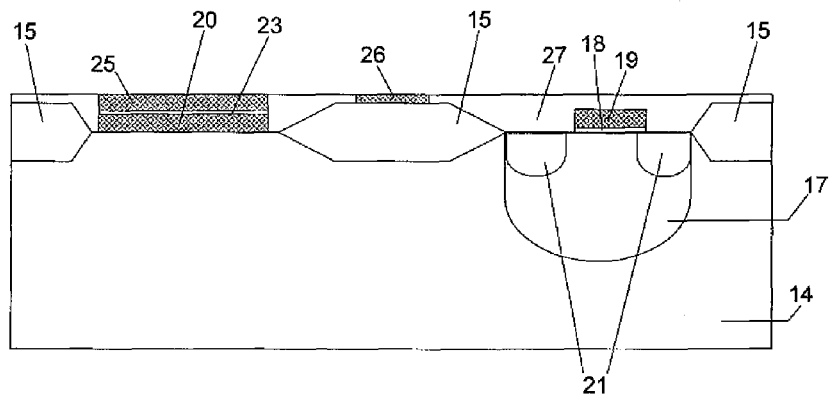

Next, as illustrated in FIG. 4B, by chemical mechanical polishing (CMP), which is an existing planarizing technology, the entire surface of the substrate is ground down until the polysilicon film of the resistor has a desired thickness. In this manner, as illustrated in FIG. 4C, owing to the difference in thickness of the active region and the element isolation region, polysilicon films having different thicknesses are formed, which are to be formed as the upper electrode 25 of the capacitor and the resistor 26.

In this embodiment, by CMP, the surface is ground down while planarizing the surface, to thereby form the upper electrode of the capacitor and the resistor having different thicknesses. Alternatively, a planarization film such as BPSG and ozone TEOS may be used to planarize the interlayer insulator, and the entire surface of the substrate may be subjected to etch-back. Also in this case, the effect similar to that of this embodiment can be obtained.

FIG. 4B illustrates a view in a case where the surface of the upper electrode of the capacitor is ground down, but by adjusting the height of the element isolation region 2, the surface of the upper electrode 25 of the capacitor may not be ground down. This embodiment also includes the case where the surface of the upper electrode 25 of the capacitor is not ground down by adjusting the height of the element isolation region 2.

Next, N-type impurities are ion-implanted into the polysilicon film to be formed as the upper electrode of the capacitor. Further, P-type impurities are ion-implanted into the polysilicon film to be formed as the resistor. Then, heat treatment is performed, to thereby form the upper electrode 25 of the capacitor and the resistor 26.

Next, an interlayer insulator is formed on the entire surface of the substrate, and then etching is performed to open contact holes (not shown). Steps after the contact holes are formed, that is, a step of forming electrode wiring and subsequent steps (process of forming metal wiring and a protective film) are the same as steps in a general method of manufacturing a semiconductor device, and hence detailed description thereof is omitted.

The above is the manufacturing method according to this embodiment.

This embodiment is described by means of a specific example, but modifications of the respective conditions are possible without departing from the scope of the present invention.

According to this embodiment described above, the following effects can be obtained.

According to the present invention, by utilizing the step formed between the active region and the element isolation region, the thin resistor having a high resistance and the thick upper electrode of the capacitor can be simultaneously formed, and hence the capacitor can be formed in the common process with the high resistance resistor necessary for an analog circuit, and further, the capacitor with a sufficient function can be manufactured.

What is claimed is:

1. A method of manufacturing a semiconductor device, comprising:
   (a) forming an active region and an element isolation region on a semiconductor substrate, the element isolation region having a surface higher in height than a surface of the active region;
   (b) forming a gate oxide film of a transistor element on a well region of a first conductivity type formed along a main surface of the semiconductor substrate on the active region;
   (c) forming a first polysilicon film on the semiconductor substrate;
   (d) patterning the first polysilicon film, to thereby form, in the active region, a gate electrode of the transistor element and a lower electrode of a capacitor;
   (e) implanting impurities of a second conductivity type into the gate electrode and the lower electrode;
   (f) implanting impurities of the second conductivity type into a surface of the well region of the first conductivity type with use of the gate electrode as a mask, to thereby form a source region and a drain region of the transistor element;
   (g) forming a capacitor insulator on the lower electrode of the capacitor;
   (h) forming a second polysilicon film on the semiconductor substrate;
   (i) patterning the second polysilicon film, to thereby form an upper electrode of the capacitor in the active region, and a resistor in the element isolation region;
   (j) implanting impurities of the second conductivity type into the upper electrode;
   (k) implanting impurities of the first conductivity type into the resistor;
   (l) forming a first interlayer insulator on the semiconductor substrate;
   (m) grinding down at least the first interlayer insulator and the resistor until the resistor has a thickness different from the thickness of the upper electrode of the capacitor and the thickness difference therebetween is determined depending on the difference between the surface heights of the active region and the element isolation region and on a thickness of the first polysilicon film;
   (n) forming a second interlayer insulator on the semiconductor substrate; and
   (o) forming a contact hole on the second interlayer insulator.

2. A method of manufacturing a semiconductor device according to claim 1, wherein the step (a) comprises forming the element isolation region by LOCOS.

3. A method of manufacturing a semiconductor device according to claim 1, wherein the step (m) is carried out by chemical mechanical polishing.

4. A method of manufacturing a semiconductor device according to claim 1, wherein:
   the first interlayer insulator is used as a planarization film; and
   the step (m) comprises etch-back.

5. A method of manufacturing a semiconductor device according to claim 1, wherein the step (e) and the step (f), or the step (f) and the step (j) are carried out simultaneously.

* * * * *